(12) United States Patent
Yang et al.

(10) Patent No.: US 9,686,837 B1
(45) Date of Patent: Jun. 20, 2017

(54) FOLDABLE DISPLAY DEVICE

(71) Applicant: LG DISPLAY CO., LTD., Seoul (KR)

(72) Inventors: Jae-Hun Yang, Gyeongsan-si (KR); Gee-Sung Chae, Incheon (KR); Tae-Woo Kim, Paju-si (KR); Noh-Jin Myung, Paju-si (KR); Tae-Hyoung Kwak, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/374,404

(22) Filed: Dec. 9, 2016

(30) Foreign Application Priority Data

Dec. 11, 2015 (KR) ........................ 10-2015-0177409

(51) Int. Cl.
*H01J 1/62* (2006.01)
*H05B 33/22* (2006.01)
*H05K 1/02* (2006.01)

(52) U.S. Cl.
CPC ............. *H05B 33/22* (2013.01); *H05K 1/028* (2013.01); *H05K 2201/055* (2013.01); *H05K 2201/10128* (2013.01)

(58) Field of Classification Search
CPC ........................ H05K 1/028; H05K 2201/055
USPC .................................................. 313/511, 506
See application file for complete search history.

*Primary Examiner* — Vip Patel
(74) *Attorney, Agent, or Firm* — Dentons US LLP

(57) ABSTRACT

Disclosed is a foldable display device comprising: a display panel comprising a display area, and one or more foldable areas and non-foldable areas located within the display area; a cover film disposed on a front surface of the display panel; a support disposed at a back surface of the display panel; and a drive circuit to drive the display panel. One of the foldable areas may be located at a display surface near one edge area of the display panel, such that the edge area of the display panel is folded toward the back surface of the display panel, and the drive circuit is located on a flexible printed circuit board provided at the back surface of the display panel while being connected to the edge area of the display panel.

9 Claims, 6 Drawing Sheets

FOLDABLE DISPLAY DEVICE

CROSS-REFERENCE TO RELATED APPLICATION

This application claims the benefit of Korean Patent Application No. 10-2015-0177409, filed on Dec. 11, 2015, which is hereby incorporated by reference as if fully set forth herein.

BACKGROUND OF THE INVENTION

Field of the Invention

The present invention relates to a foldable display device, including a foldable display device in which a part of the display area is folded such that a drive circuit, including pads and a flexible printed circuit board (FPCB) area on which the drive circuit is mounted, are disposed at the bottom of a back surface of the display device. As a result, the display device is capable of not only realizing a bezelless panel, but also using a side surface of the folded display device as a side display.

Discussion of the Related Art

Image display devices, which render a variety of information on a screen, are core technologies of the information communication age, and are being developed t thin, light, portable, and capable of high performance. As a result, an organic light emitting display device or the like, which displays an image based on the amount of light emitted from an organic light emitting layer, is of increasing importance as a flat display device capable of eliminating drawbacks of a cathode ray tube (CRT), for example, by reducing the weight and volume of a display device.

In an exemplary embodiment, such an organic light emitting display device includes a plurality of pixels arranged in a matrix, to display an image. Each pixel includes a light emitting element and a pixel driving circuit, including a plurality of transistors, to drive the light emitting element in an independent manner.

In another exemplary embodiment, an organic light emitting display device uses self-luminous organic light emitting elements and, as such, no separate light source is needed. Thus, such a display device may be an ultra-thin display device. Active research into a foldable display having an in-cell touch structure while using organic light emitting elements is being conducted. In such an in-cell touch structure, a touch electrode array is included in each light emitting cell.

Such a foldable display does not, generally, use a cover window because the display panel thereof is foldable. For this reason, a cover film made of a film-formable material is applied to the foldable display. Such a cover film is made of a soft material, and thus, may exhibit inferior durability compared to a cover glass. For this reason, when touch electrodes and a drive circuit to drive light emitting cells are disposed at a front surface of the foldable display, there may be a problem in that the drive circuit is easily damaged by external impact.

SUMMARY OF THE INVENTION

Accordingly, the present disclosure is directed to a foldable display device that substantially obviates one or more problems due to limitations and disadvantages of the related art.

In an exemplary aspect, the present disclosure provides a foldable display device in which at least one part of a display area is folded such that a drive circuit, including pads of a display panel and a flexible printed circuit board (FPCB) area on which the drive circuit is mounted, are disposed at the bottom of a back surface of the display device. Thus, the display device may not only include a bezelless panel, but the side surface of the folded display device may be used as a side display.

To achieve these objects and other advantages and in accordance with the purpose of the invention, as embodied and broadly described herein, a foldable display device includes a foldable area and a non-foldable area. One of the foldable areas located at a display surface is located near one edge area of a display panel such that the edge area of the display panel is folded toward a back surface of the display panel. A protective film may be attached to a front surface of the display panel; and a support for the display panel may be disposed at the back surface of the display panel.

In an exemplary embodiment, the present disclosure provides a foldable display device comprising: a display panel comprising a display area, and one or more foldable areas and non-foldable areas located within the display area; a cover film disposed on a front surface of the display panel; a support disposed at a back surface of the display panel; and a drive circuit to drive the display panel. In such an exemplary embodiment, one of the foldable areas is located at a display surface near one edge area of the display panel, such that the edge area of the display panel is folded toward the back surface of the display panel, and the drive circuit is located on a flexible printed circuit board provided at the back surface of the display panel while being connected to the edge area of the display panel.

In another exemplary embodiment, the support comprises soft portions disposed at regions corresponding to the foldable areas, and a hard portion disposed at regions corresponding to the non-foldable areas.

In another exemplary embodiment, the hard portion has a frame or film structure made of a polymer material, a metal or a combination thereof; and the soft portions are made of silicon, urethane or a combination thereof.

In another exemplary embodiment, the support comprises a groove disposed at a region contacting the drive circuit; and the drive circuit is inserted into the groove.

In another exemplary embodiment, the foldable display device further comprises a set case disposed at a back surface of the support and a back surface of the flexible printed circuit board, such that the set case covers the support; and a side cover to cover the foldable area disposed near the edge area of the display panel.

In another exemplary embodiment, the foldable display device further comprises an accessory area provided at a back surface of the support and a back surface of the flexible printed circuit board, such that the accessory area received the printed circuit board and a battery, and the drive circuit is disposed at a back surface of the accessory area.

In another exemplary embodiment, when the display panel is folded to cover the front surface of the display panel, each of the foldable areas displays an image in the folded display panel.

In another exemplary embodiment, when the display panel is folded to partially expose a portion of the front surface of the display panel, the foldable areas and the exposed portion of the front surface of the display panel display images in the folded display panel.

In another exemplary embodiment, when the display panel is folded such that a portion of a display surface of the display panel is disposed at a back surface of the foldable display device, the portion of the display surface disposed at the back surface of the display panel and the foldable areas display images in the folded display panel.

It is to be understood that both the foregoing general description and the following detailed description of the present invention are exemplary and explanatory and are intended to provide further explanation of the invention as claimed. Additional advantages, objectives, and features of the present disclosure will be set forth in part in the description which follows and in part will become apparent to those having ordinary skill in the art upon examination of the following or may be learned from practicing the invention described herein. The objectives and other advantages of the present disclosure may be realized and attained by the structure particularly pointed out in the written description and claims hereof as well as the appended drawings, but the present disclosure is not limited thereto, and may further include any combination of the features described herein or otherwise falling within the scope of this disclosure and any appended claims and drawings.

BRIEF DESCRIPTION OF THE DRAWINGS

The accompanying drawings, which are included to provide a further understanding of the invention and are incorporated in, and constitute a part of, this application, illustrate embodiment(s) of the invention and along with the description serve to explain the principle of the invention. In the drawings.

DETAILED DESCRIPTION OF THE INVENTION

Figure 1:
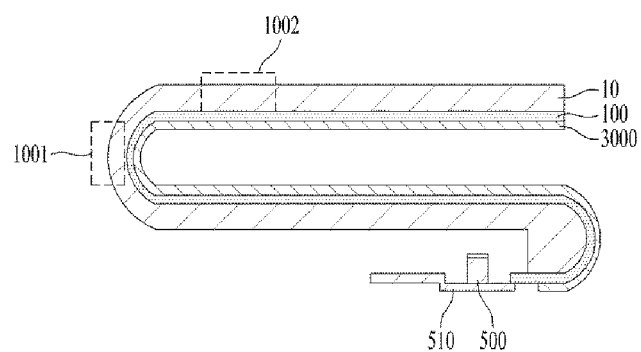
FIG. 1 is an exemplary illustration of a foldable display device according to a first embodiment of the present disclosure.

Hereinafter, preferred embodiments of the present disclosure will be described in detail with reference to the accompanying drawings. Throughout the disclosure, the same reference numerals designate substantially the same constituent elements. Moreover, detailed descriptions of publicly known technologies to which the present disclosure pertains will be omitted if such description is deemed to obscure the gist of the present disclosure. In addition, names of constituent elements used in the following description are selected for easy understanding of the present disclosure, and may differ from names of practical products.

Advantages and features of the present invention, and implementation methods thereof will be clarified by the following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present application to those skilled in the art. The present invention is only defined by the scope of any appended claims.

A shape, a size, a ratio, an angle, and a number disclosed in the drawings for describing embodiments of the present disclosure are merely exemplary, and thus, the present invention is not limited to the illustrated details. Like reference numerals refer to like elements throughout. In the following description, when the detailed description of relevant known functions or configurations are determined to unnecessarily obscure the important points of the present disclosure, the detailed description will be omitted. The terms 'comprise', 'have', and 'include' in the present specification may include additional parts unless the term 'only~' is also used with such terms. The terms of a singular form may include plural forms unless referred to the contrary.

In construing an element, an error range may be included even if no explicit description regarding the same in included in the specification.

In describing a position relationship, for example, when a position relation between two parts is described as 'on~', 'over~', 'under~', or 'next~', one or more parts may be disposed between the two parts unless the term 'just' or 'direct' is also used with such terms.

In describing a time relationship, for example, when the temporal order is described as 'after~', 'subsequent~', 'next~', or 'before~', a case which is not continuous may be included unless the term 'just' or 'direct' is also used with such terms.

Although the terms "first", "second", etc. may be used herein to describe various elements, these elements are not be limited by these terms. These terms are only used to distinguish one element from another. For example, a first element could, alternatively, be termed a second element, and, similarly, a second element could, alternatively, be termed a first element, without departing from the scope of the present disclosure.

Features of various embodiments of the present disclosure may be partially or completely coupled to, or combined with, each other, and may be variously inter-operated with each other and driven technically as those skilled in the art can sufficiently understand. Further, the embodiments of the present disclosure may be carried out independently from each other, or may be carried out together in co-dependent relationship.

Hereinafter, various embodiments of the present disclosure will be described in detail with reference to the accompanying drawings.

Figure 2:
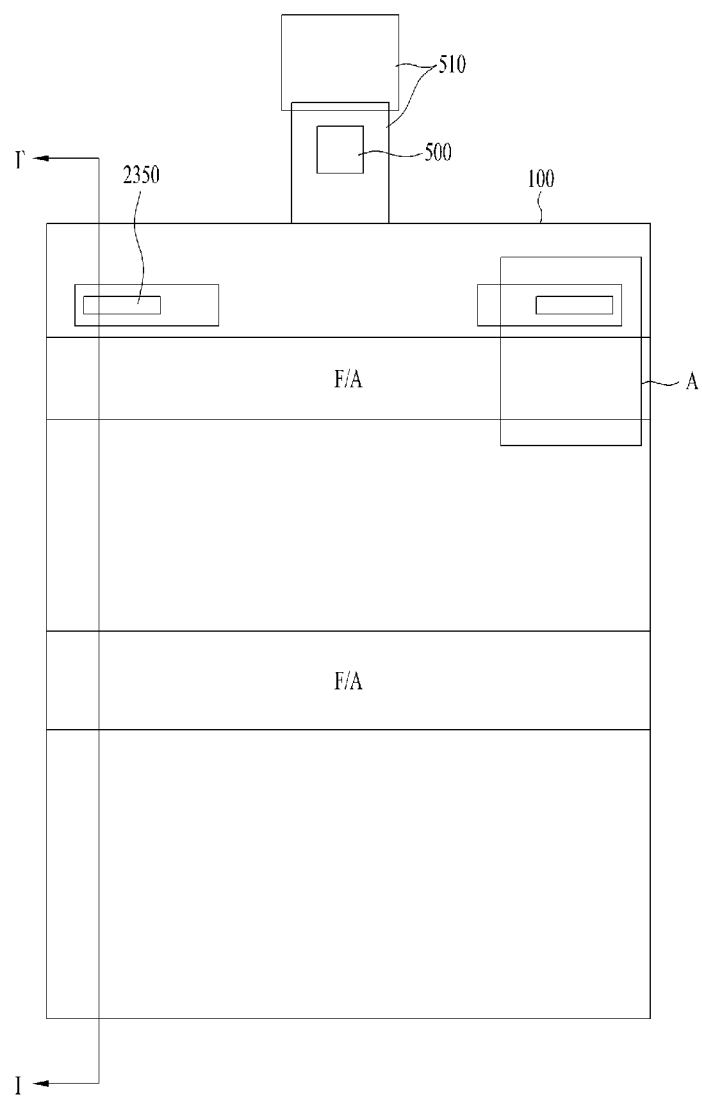
FIG. 2 is a plan view illustrating an unfolded state of the foldable display device of FIG. 1.

FIG. 1 is an exemplary illustration of a foldable display device according to an embodiment of the present disclosure. FIG. 2 is a plan view illustrating an unfolded state of the foldable display device illustrated in FIG. 1, and explains the configuration of the display device.

As illustrated in FIGS. 1 and 2, the foldable display device according to an exemplary embodiment of the present disclosure includes a display panel 100 including a display area having one or more foldable areas F/A, a cover film 3000 to cover a front surface of the display panel 100, and a support 10 located at a back surface of the display panel 100, to support the display panel 100.

One of the foldable areas F/A located near one edge area of the display panel 100 is folded so that the edge area of the display panel 100 near foldable area F/A is located beneath the back surface of the display panel. In this case, a flexible printed circuit board (PCB) 510 is connected to the edge area of the display panel 100, and a drive circuit 500 is mounted on the flexible PCB 510. Accordingly, the drive circuit 500 is located beneath the back surface of the display panel 100 and, as such, is protected from external impact by the display panel 100.

Meanwhile, the foldable area F/A located near the edge area is a portion of the display area and, as such, functions as a side display.

In this case, the support 10 includes soft portions 1001 corresponding to respective foldable areas F/A, and a hard portion 1002 corresponding to a portion of the non-foldable area. Each soft portion 1001 is made of silicon, urethane, or a combination thereof, to be easily foldable. On the other hand, the hard portion 1002 is made of a polymer or a metal, or is formed of a metal film or frame, to have hardness and, as such, cannot be folded.

Figure 3:
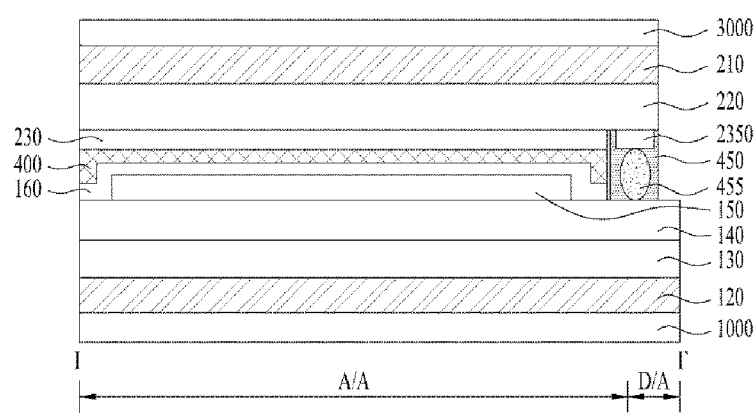
FIG. 3 is a cross-sectional view along line I-I' of the foldable display device illustrated in FIG. 2.

FIG. 3 is a cross-sectional view along line I-I' of the display device illustrated in FIG. 2. As illustrated in FIG. 3, an organic light emitting display device illustrated in FIG. 2 includes a lower substrate 1000, a first etch prevention film 120 and a first buffer layer 130, which are formed over the lower substrate 1000 in this order, a thin film transistor (TFT) array 140 formed over the first buffer layer 130. The TFT layer includes pixels arranged in matrix form and having TFTs for respective pixels. The display device further includes an organic light emitting array 150 connected to the TFTs of the pixels, a passivation layer 160 covering the TFT array 140 and organic light emitting array 150 in a region other than a pad portion, a touch electrode array 230 bonded to the passivation layer 160 via a bonding layer 400 interposed between the passivation layer 160 and the touch electrode array 230, a second buffer layer 220 and a second etch prevention film 210 formed over the touch electrode array 230 in this order, and a cover film 3000 disposed on the second etch prevention film 210.

In this embodiment, the touch electrode array 230 is formed on an upper substrate (not shown). The touch electrode array 230 is connected to the lower substrate 100 by the bonding layer 400, and the upper substrate is then removed using an appropriate method, such as laser irradiation.

The first and second etch prevention films 120 and 210 prevent damage of internal arrays during laser irradiation or etching of the upper substrate and the lower substrate 1000. If necessary, the first and second etch prevention films 120 and 210 may be dispensed with, so long as damage to internal arrays during removal of the upper and lower substrates is securely prevented. The first and second etch prevention films 120 and 210 may be made of polyimide (PI), photo acryl or the like.

As further illustrated in FIG. 3, an active region (A/A) and a dead region (D/A) are defined on the lower substrate 100. The TFTs of the TFT array 140, except the pad portion, the organic light emitting array 150 and the touch electrode array 230 are formed in the active region. A touch electrode pad portion 2350 and a pad portion of the TFT array 140 are formed in a portion of the dead region.

In addition, the touch pad portion 2350 is formed at the second buffer layer 220 on the same plane as the touch electrode array 230.

In the process of assembling the upper and lower substrates via the bonding layer 400, the touch pad portion 2350 is connected to the pad portion of the TFT array 140 by a seal 450, which includes conductive balls 455. The bonding layer 400 prevents moisture penetration. The bonding layer 400 directly contacts the passivation layer 160 covering the organic light emitting array 150 and, as such, prevents penetration of moisture while also preventing ambient air from penetrating into the organic light emitting array 150, together with the passivation layer 160. In this case, the TFT array 140 is formed to protrude laterally beyond the touch electrode array 230, including the pad portion thereof. The flexible PCB 510, on which the drive circuit 500 to drive the touch electrode array and the TFT array 140 is mounted, is bonded to the protruded portion of the TFT array 140, as illustrated in FIG. 1. Meanwhile, an anisotropic conductive film (ACF) may be formed at the protruded portion of the TFT array 140.

Mounting of the drive circuit 500 on the flexible PCB 510 or ACT may be achieved in a chip-on-film (COF) manner.

Although not shown, drive pads and dummy pads of the TFT array 140 are connected to the flexible PCB 510 by wirings (not shown) formed on the lower substrate 1000. A controller (not shown) to control the drive circuit 500 may be further provided at the flexible PCB 510. The dummy pads of the TFT array are formed in a portion of the dead region outside the active region on the same layer as a metal layer forming gate lines or data lines.

The touch pad portion 2350 includes a plurality of pad electrodes. Routing lines are provided at opposite lateral surfaces of the lower substrate 1000 to extend in a y-axis direction. The routing lines connect the touch electrodes provided at the touch electrode array 230 to the touch pad portion 2350.

The conductive balls 455, which are connected to the touch pad portion 2350, are electrically connected to dummy electrodes (not shown) formed at a peripheral portion of the TFT array 140.

Figure 4:
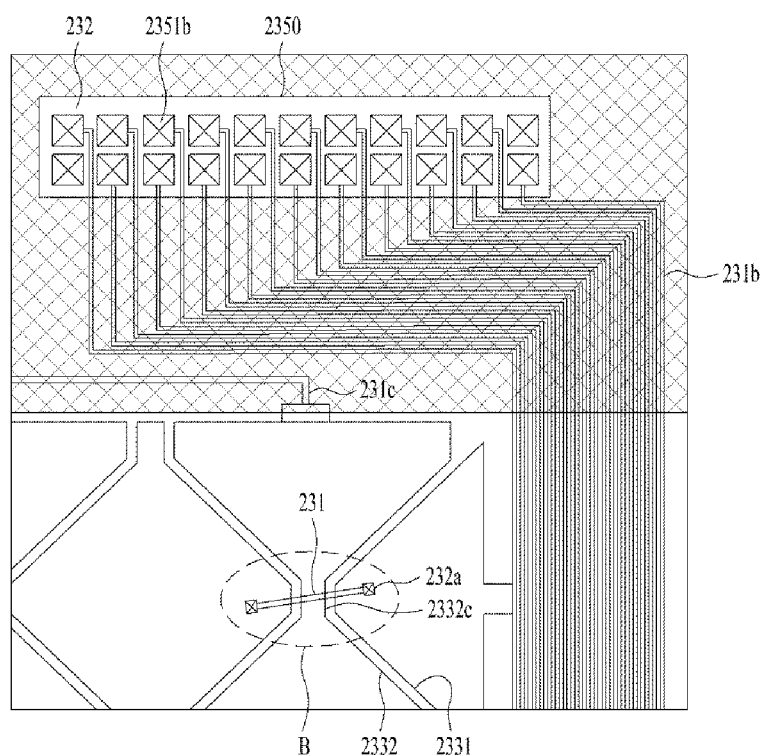
FIG. 4 is a plan view and FIG. 5 is a cross-sectional view illustrating the connection between the bridges and touch electrodes of the foldable display device illustrated in FIG. 2.
Figure 5:
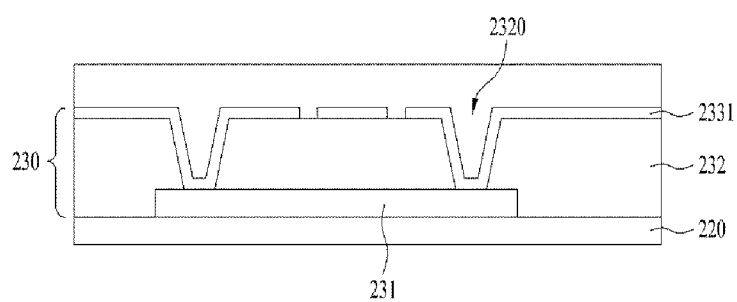

FIG. 4 is a plan view and FIG. 5 is a sectional views illustrating the connection between the bridges and touch electrodes of the display device according to exemplary embodiments of the present disclosure.

As illustrated in FIGS. 4 and 5, in accordance with an embodiment of the present invention, the touch electrode array 230 includes first and second touch electrodes crossing each other, and touch pads 2351b provided at the touch pad portion 2350 to send signals to the first and second touch electrodes, respectively. The touch pads 2351b may be connected to dummy pads (not shown) formed in the dead region of the TFT array. The TFT array 140, which includes dummy pads, is illustrated in FIG. 2. FIG. 2 also illustrates a single layer including the touch pads and the first and second touch electrodes designated by 2331 and 2332, respectively, as a touch electrode layer. The touch electrode layer is patterned to have electrode patterns corresponding to respective electrodes.

In this exemplary embodiment, the first touch electrode includes island-shaped first electrode patterns 2331 physically spaced apart from one another in a first direction, and metal bridges 231, each electrically connecting adjacent first electrode patterns 2331. The second touch electrode includes second electrode patterns 2332 arranged in a direction crossing the first direction while having the same shape as the first electrode patterns 2331, and connecting patterns 2332c each integrated with, and connecting, adjacent second electrode patterns 2332.

The first electrode patterns 2331, second electrode patterns 2332 and connecting patterns 2332c are transparent, and constitute a first layer. The metal bridges 231 constitute a second layer under the condition that a first interlayer insulating film 232 is interposed between the first layer and the second layer. The first interlayer insulating film may be provided with contact holes 232a at regions where the second electrode patterns 2332 overlap the metal bridges 231, respectively.

In this exemplary embodiment, because the touch electrode array 230 is formed on an upper substrate (not shown), the touch electrode array 230 is formed in such a manner that, after formation of the metal bridges 231, first interlayer insulating film 232 and contact holes 232a, the first electrode patterns 2331, second electrode patterns 2332 and connecting patterns 2332c are formed. The surface of the upper substrate, on which the touch electrode array 230 is formed, is bonded to the organic light emitting array 150 such that the touch electrode array 230 illustrated in FIG. 5 is arranged in a 180°-rotated state.

Routing lines 231b and 231c are formed at a non-display area of the lower substrate 1000 near an edge region where the first and second electrode patterns 2331 and 2332 are not formed, and are connected to the touch pad portion 2350 and the first and second electrode patterns 2331 and 2332. The routing lines 231b are connected to the first and second electrode patterns 2331 and 2332 to send signals from the touch pads 2351b to the first and second electrode patterns 2331 and 2332.

The above-described touch electrode array 230 is a mutual capacitive electrostatic touch electrode array. However, the touch electrode array 230 of the organic light emitting display device of the present disclosure may have various structures other than the above-described structure.

Figure 6:
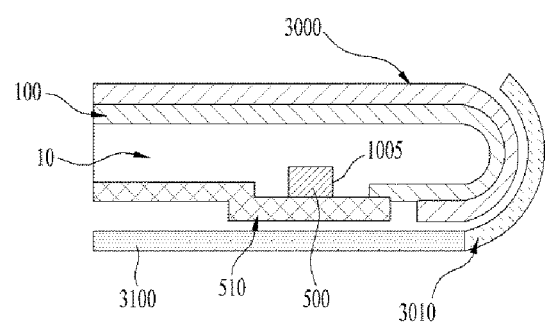
FIG. 6 is an exemplary illustration of a foldable display device according to a second embodiment of the present disclosure, which further includes a side cover and an accessory area under the condition that the drive circuit is inserted into the support.

FIG. 6 is a side view illustrating the foldable display device of another exemplary embodiment of the present disclosure, which further includes a side cover and an accessory area when the drive circuit is inserted into the support.

The support 10 of the foldable display device illustrated in FIG. 6 may include a groove 1005 formed at a back surface of the support 10 in a region corresponding to the drive circuit 500 to allow the drive circuit 500 mounted on the flexible PCB 510 to be inserted into the support 10. The groove 1005 has a dimension of about 1 to 1.5 mm to receive the drive circuit 500. When the groove 1005 is provided at the support 10, as described above, t the drive circuit 500 may be securely protected against external impact.

As further illustrated in FIG. 6, the foldable area disposed near an edge area is included in the display area and, as such, may be used as a side display. In addition, a side cover 3010 may be located above a display surface of the side display to protect the side display from external impact.

A set case (not shown) or an accessory area 3100 may also be provided at the back surface of the flexible PCB 510 on which the support 10 and drive circuit 500 are mounted. When the accessory area 3100 is provided, the display device may have a compact shape because no additional space to receive accessories is needed, as compared to a display device in which a set case is provided.

In this exemplary embodiment, a PCB, on which various accessories required for the foldable display device are mounted, or a battery to supply electric power to the foldable display device is disposed at the accessory area 3100.

Figure 7A:
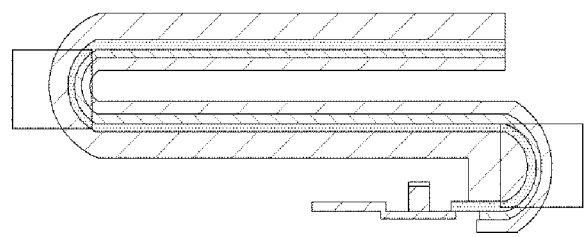
FIG. 7A to 7C are exemplary illustrations of foldable display devices implemented in accordance with various folding areas of the present disclosure.
Figure 7B:
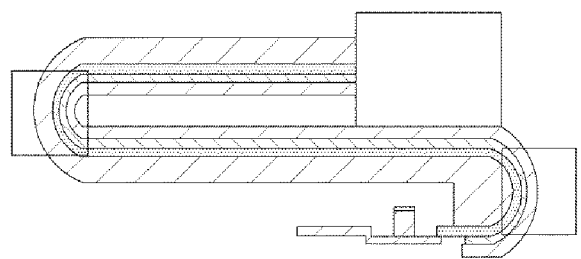
Figure 7C:
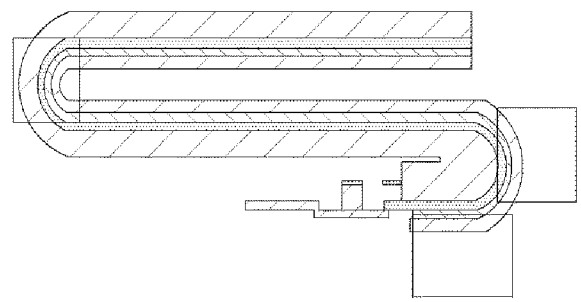

FIGS. 7A to 7C illustrate various examples of the foldable display device implemented in accordance with various folding areas of the present disclosure. The area indicated by a block in FIGS. 7A to 7C represents a display area in a folded state of the foldable display device.

As illustrated in FIG. 7A, the foldable display device may be folded such that a front display area is completely covered. In such a folded state, it may be possible to display an image through the side surfaces of the foldable display device.

In another exemplary embodiment, as illustrated in FIG. 7B, the foldable display device may be folded such that the front display area is partially exposed. In such a folded state, it may be possible to display images through an exposed portion of the front display area as well as the side surfaces of the foldable display device.

In another exemplary embodiment, as illustrated in FIG. 7C, the foldable display device may be folded such that a portion of the front display area is disposed at the back surface side of the foldable display device. In such a folded state, the display area portion folded to be disposed at the back surface side of the foldable display device may be used as a back display, and it may be possible to display images through the side surfaces of the foldable display device as well as a back surface of the foldable display device.

The drive circuit of the foldable display device of the present disclosure is mounted on the flexible PCB. Accordingly, the drive circuit may be protected from external impact by the display panel by being disposed beneath the back surface of the display panel.

The foldable area disposed near the edge area is a portion of the display area and, as such, functions as a side display. Accordingly, the display device of the present disclosure has a feature in that the display device can also display an image through a side surface thereof.

Meanwhile, when the support is provided with a groove to receive the drive circuit board, there may be an effect of more securely protecting the drive circuit from external impact.

A number of examples have been described above, but the present disclosure is not limited thereto. It will be apparent to those skilled in the art that various modifications and variations can be made to the present disclosure without departing from the spirit or scope of the intended inventions. For example, suitable results may be achieved if the described techniques are performed in a different order and/or if components in a described system, architecture, device, or circuit are combined in a different manner and/or replaced or supplemented by other components or their equivalents. Thus, it is intended that the present disclosure covers the modifications and variations of the intended invention provided they fall within the scope of any appended claims and their equivalents.

What is claimed is:

1. A foldable display device comprising:
    a display panel comprising a display area, and one or more foldable areas and non-foldable areas located within the display area;
    a cover film disposed on a front surface of the display panel;
    a support disposed at a back surface of the display panel; and
    a drive circuit to drive the display panel,
    wherein one of the foldable areas is located at a display surface near one edge area of the display panel, such that the edge area of the display panel is folded toward the back surface of the display panel, and wherein the drive circuit is located on a flexible printed circuit board provided at the back surface of the display panel while being connected to the edge area of the display panel.

2. The foldable display device according to claim 1, wherein the support comprises soft portions disposed at regions corresponding to the foldable areas, and a hard portion disposed at regions corresponding to the non-foldable areas.

3. The foldable display device according to claim 2, wherein:

the hard portion has a frame or film structure made of a polymer material, a metal or a combination thereof; and the soft portions are made of silicon, urethane or a combination thereof.

4. The foldable display device according to claim 1, wherein:

the support comprises a groove disposed at a region contacting the drive circuit; and the drive circuit is inserted into the groove.

5. The foldable display device according to claim 1, further comprising:

a set case disposed at a back surface of the support and a back surface of the flexible printed circuit board, such that the set case covers the support; and a side cover to cover the foldable area disposed near the edge area of the display panel.

6. The foldable display device according to claim 1, further comprising:

an accessory area provided at a back surface of the support and a back surface of the flexible printed circuit board, such that the accessory area received the printed circuit board and a battery, and wherein the drive circuit is disposed at a back surface of the accessory area.

7. The foldable display device according to claim 1, wherein when the display panel is folded to cover the front surface of the display panel, each of the foldable areas displays an image in the folded display panel.

8. The foldable display device according to claim 1, wherein when the display panel is folded to partially expose a portion of the front surface of the display panel, the foldable areas and the exposed portion of the front surface of the display panel display images in the folded display panel.

9. The foldable display device according to claim 1, wherein when the display panel is folded such that a portion of a display surface of the display panel is disposed at a back surface of the foldable display device, the portion of the display surface disposed at the back surface of the display panel and the foldable areas display images in the folded display panel.

* * * * *